United States Patent [19]

Kaga et al.

[11] Patent Number: 4,873,203
[45] Date of Patent: Oct. 10, 1989

[54] METHOD FOR FORMATION OF INSULATION FILM ON SILICON BURIED IN TRENCH

[75] Inventors: Toru Kaga, Urawa; Shinichiro Kimura, Hachiouji; Tokuo Kure, Kokubunji; Yoshifumi Kawamoto, Kanagawa; Hideo Sunami, Tokyo, all of Japan

[73] Assignee: Hitachi, Ltd., Tokyo, Japan

[21] Appl. No.: 221,351

[22] Filed: Jul. 19, 1988

[30] Foreign Application Priority Data

Jul. 27, 1987 [JP] Japan ................................ 62-185481

[51] Int. Cl.⁴ ........................................... H01L 21/76
[52] U.S. Cl. ....................................... 437/67; 437/78; 437/72
[58] Field of Search ................. 437/61, 63, 67, 78, 437/72; 357/49, 50

[56] References Cited

FOREIGN PATENT DOCUMENTS

| 0116789 | 8/1984 | European Pat. Off. | 437/67 |
| 59-108325 | 6/1984 | Japan | 437/67 |
| 60-38832 | 2/1985 | Japan | 437/67 |
| 60-149148 | 8/1985 | Japan | 437/67 |
| 60-149149 | 8/1985 | Japan | |
| 61-115336 | 6/1986 | Japan | |
| 61-201445 | 9/1986 | Japan | 437/67 |
| 61-214446 | 9/1986 | Japan | 437/67 |
| 63-86560 | 4/1988 | Japan | 437/67 |
| 2179788 | 3/1987 | United Kingdom | 437/67 |

*Primary Examiner*—Olik Chaudhuri
*Attorney, Agent, or Firm*—Antonelli, Terry & Wands

[57] ABSTRACT

An insulation film on silicon buried in a trench is prepared by forming a field oxide film by using a first $Si_3N_4$ mask formed on a silicon substrate, forming a second $Si_3N_4$ mask for formation of a trench, forming a trench in the silicon substrate by using the second $Si_3N_4$ mask, burying polycrystalline silicon in the trench, removing the second $Si_3N_4$ mask while leaving the first $Si_3N_4$ mask and oxidizing the surface of the polycrystalline silicon buried in the trench by thermal oxidation. The so-formed insulation film on silicon buried in the trench has a uniform thickness and a high dielectric strength. The surface of the substrate at a part where an active element will be formed in the future is not oxidized.

20 Claims, 9 Drawing Sheets

METHOD FOR FORMATION OF INSULATION FILM ON SILICON BURIED IN TRENCH

BACKGROUND OF THE INVENTION

The present invention relates to a method for forming an insulation film on the surface of silicon buried in a trench formed in a substrate. More particularly, the present invention relates to a method for forming an insulation film having a high quality on the surface of a semiconductor constituting a trench type capacitor. More particularly, the present invention relates to a method for forming an insulating film on the surface of a semiconductor constituting a capacitor of DRAM (dynamic random access memory) and a process for fabricating DRAM using a trench type capacitor.

The steps of typical instance of the conventional method for forming an insulation film on a trench type capacitor are shown in sectional views of FIGS. 2a through 2d. On a silicon substrate 11 having a field oxide film 14 as shown in FIG. 2a, a silicon nitride ($Si_3N_4$) film 21 is formed as shown in FIG. 2b, and the silicon nitride film 21 is shaped into a form corresponding to a desired trench form and the silicon substrate 11 is etched by using this shaped silicon film as a mask 22 to form a trench. Polycrystalline silicon 16 is buried in the trench to obtain a state as shown in FIG. 2c. Reference numeral 15 represents a silicon oxide ($SiO_2$) film. According to the conventional technique, for example, as shown in FIG. 2d, polycrystalline silicon buried in the trench is oxidized by using the $Si_3N_4$ film, which has covered the surface other than the trench at the step of forming a trench, as the mask 22 to form $SiO_2$ 17 on the surface of the polycrystalline silicon in the trench. In this case, since $Si_3N_4$ is present around the trench, the thickness of the $SiO_2$ film on the surface of the peripheral portion of the trench is much smaller than the thickness of the $SiO_2$ film on the surface of the central portion of the trench, and therefore, the dielectric strength of the peripheral portion is drastically reduced. More specifically, if the thickness of the $SiO_2$ film on the surface of the central portion of the trench is 300 nm, the thickness of the $SiO_2$ film on the surface of the peripheral portion of the trench is, for example, less than 10 nm. The reason is that the end portion of the surface of the polycrystalline silicon 16 falling in contact with $Si_3N_4$ is hardly oxidized.

Incidentally, the reason why an insulation film formed on the surface of a semiconductor constituting a trench type capacitor should have a good quality and a high dielectric strength is that, for example, DRAM generally has a structure in which a gate electrode of a transistor is placed on a trench and it is important to maintain a high dielectric strength between the gate electrode and the polycrystalline silicon 16 in the trench. FIG. 2e is a sectional view illustrating the state where a gate electrode 23 composed of polycrystalline silicon is formed on the insulation film on the trench type capacitor.

As a typical instance of the conventional technique of forming an insulation film on a trench type capacitor, there can be mentioned the method disclosed in Japanese Patent Application Laid-Open Specification No. 115336/1986. According to this conventional method, an insulation film on silicon buried in a trench is formed by the above-mentioned step shown in FIG. 2d.

Incidentally, some of the present inventors filed a patent application for DRAM comprising a trench type capacitor in the United States and Korea after the Convention priority date of the instant patent application. Namely, U.S. Pat. application Ser. No. 123,235 and Korean Pat. application No. 87-13276 were filed on Nov. 20, 1987 and Nov. 25, 1987, respectively. Each of these U.S. and Korean patent applications is only a prior application and cannot be a prior art to the present invention.

SUMMARY OF THE INVENTION

It is a primary object of the present invention to provide a method for forming an insulation film on silicon buried in a trench, in which the above-mentioned defects of the conventional technique and undesirable reduction of thickness of the insulation film on the surface of the peripheral portion of the trench is prevented, especially a method for forming an insulation film on silicon buried in a trench, in which the thickness of $SiO_2$ on the surface of the peripheral portion of the trench is increased to improve the dielectric strength.

The thickness of $SiO_2$ on the surface of the peripheral portion of the trench can be increased by removing $Si_3N_4$ covering the surface of the semiconductor substrate other than the trench and oxidizing, thereafter, the surface of the semiconductor in the trench. However, if this $Si_3N_4$ is completely removed, even a region to be formed into an active MOS transistor in the future is oxidized and no good results can be obtained. Therefore, the entire process is preferably changed. Namely, at first, a field oxide film on a silicon substrate is formed by the selective oxidation method using the $Si_3N_4$ film as a mask, and $Si_3N_4$ for forming the trench, if necessary together with $SiO_2$, is deposited on the thus treated substrate while leaving the $Si_3N_4$ mask and the $SiO_2$ thinly formed thereon.

Thereafter, these insulation films are shaped to a form corresponding to a desired trench form, and the trench is formed employing these insulation films as a mask. The field oxide film is an $SiO_2$ film formed by LOCOS (local oxidation of silicon) ordinarily adopted for separation of elements, or the like. The thickness of the $Si_3N_4$ film used as the mask for formation of the field oxide film is 50 to 300 nm, preferably 120 to 150 nm, when the CVD method available at present is adopted as the deposition method. If the thickness is too small and below this range, the number of defects, such as pinholes, formed on the film is increased, and if the thickness is to large and exceeds the above range, the stress of the film becomes too large and the wafer is warped. Accordingly, in each case, no good results can be obtained. However, if the method for forming the $Si_3N_4$ film is improved, it will be possible to expand the range of the thickness. Formation of the field Oxide film can be accomplished, for example, by holding a silicon substrate at about 1000° C. in $O_2$ gas containing a large quantity of $H_2O$ for about 2 hours. In this case, simultaneously with formation of a field oxide film having a thickness of, for example, about 500 nm, oxidation of the surface of the $Si_3N_4$ film used as the mask is caused, and an $SiO_2$ film having a thickness of about 100Å is formed. An $Si_3N_4$ film having a thickness of at least about 50 nm, if necessary together with an $SiO_2$ film, is formed thereon and shaped into a trench-forming mask. By using this mask, a trench is formed by etching and if necessary, a capacitor insulation film is formed on the side face of the trench. Then, polycrystalline silicon is buried in the trench. The thickness of the $Si_3N_4$ film for forming the trench is at least about 50 nm and ordinarily about 200 nm. If the thickness of this $Si_3N_4$ film is smaller than 50 nm the film cannot resist the etching operation. Although the upper limit of the thickness of the $Si_3N_4$ film for forming the trench is not particularly critical, the thickness is ordinarily u to 300 to 400 nm.

Before the surface of the polycrystalline silicon in the trench is finally oxidized, only the $Si_3N_4$ for formation of the trench is removed by highly selective etching using hot phosphoric acid or the like. Then, the final oxidation is carried out. According to this method, high-quality $SiO_2$ is formed on silicon buried in the trench. Moreover, the region to be formed into an active MOS transistor in the future is not oxidized, and the above-mentioned object of the present invention can be attained.

For removal of the $Si_3N_4$ for formation of the trench, instead of selective etching using hot phosphoric acid, there may be adopted the dry etching method using a plasma of a fluorine-containing gas such as a mixed gas of $CF_4$ and $O_2$, $CH_2F_2$, $CHF_3$, $CH_3F$ or mixed gas of $CH_4$ and $F_2$. In case of selective etching using hot phosphoric acid, the phosphoric acid concentration is at least 85%, and the temperature is ordinarily 160 to 180° C. If the boiling point of phosphoric acid (the boiling point rises as the concentration of phosphoric acid is increased) is used as the etching temperature the control is especially facilitated. Temperature outside the above-mentioned range can be used as the temperature of phosphoric acid. If the temperature is too low, the etching speed is low and the etching process becomes economically disadvantageous. If the temperature is too high, the etching speed becomes too high and the control becomes difficult. If the $Si_3N_4$ film is etched with hot phosphoric acid under the above-mentioned conditions, the etching speed is about 50Å /min at 160° C. and about 100 Å/min at 180° C., and the selection ratio to the $SiO_2$ film is about 25 and there is no substantial temperature dependency.

Oxidation of the surface of the polycrystalline silicon in the trench is accomplished by heating in an oxidizing atmosphere, and an $SiO_2$ film having a desired thickness is formed. For example, if heating is conducted under 7 atmospheres at 900° C. for 30 minutes in an $O_2$ atmosphere containing a large quantity of $H_2O$, an $SiO_2$ film having a thickness of about 300 nm is formed. Of course, the conditions are not limited to those mentioned above.

In short, in the method for forming an insulation film on silicon buried in a trench according to the present invention, an $Si_3N_4$ mask is formed on a silicon substrate, $SiO_2$ as a field oxide film is formed by the oxidation method using this mask, a trench is formed in the Si substrate by appropriate means, polycrystalline silicon is buried in the trench, the $Si_3N_4$ present around the trench is removed except the $Si_3N_4$ mask for formation of the field oxide film, and the surface of the polycrystalline silicon is oxidized to form an $SiO_2$ film.

More specifically, the present invention provides a method for forming an insulation film on silicon buried in a trench, which comprises forming a mask composed of first $Si_3N_4$ on a silicon substrate, forming $SiO_2$ as a field oxide film by the oxidation method using said first $Si_3N_4$ as a mask, forming a second $Si_3N_4$ on said field oxide film and said first $Si_3N_4$ mask (including thin $SiO_2$ formed thereon), further forming $SiO_2$ if necessary, shaping the so-formed insulation films into a mask, etching the silicon substrate using said mask to form a trench, forming an insulation film on the inner wall surface of the trench according to need, burying polycrystalline silicon, thereafter, in the trench, removing the second $Si_3N_4$ while leaving the first $Si_3N_4$, and oxidizing the surface of the polycrystalline silicon buried in the trench to form an $SiO_2$ film.

Incidentally, there may be adopted a method in which after the polycrystalline silicon has been buried in the trench, first oxidation of the surface of the polycrystalline silicon is carried out without removal of the second $Si_3N_4$ to form first $SiO_2$, the second $Si_3N_4$ is then removed and the second oxidation is then carried out to form thick $SiO_2$ on the polycrystalline silicon buried in the trench.

In the method for forming an insulation film on silicon buried in a trench according to the present invention, the $Si_3N_4$ used for formation of the field oxide film acts as the film for preventing oxidation of the surface of the silicon substrate at the step of oxidizing the surface of the polycrystalline silicon in the trench, and the thin $SiO_2$ on this $Si_3N_4$ acts as the film for preventing etching of the underground $Si_3N_4$ at the step of removing the $Si_3N_4$ used for forming the trench. Since the $Si_3N_4$ used for forming the trench, which covers the surface other than the trench, is selectively removed according to the above procedures, at the step of oxidizing the surface of the polycrystalline silicon in the trench, no influence of the oxidation is imposed on an other surface of the Si substrate. Furthermore, since the oxidation-inhibiting film adjacent to the surface of the polycrystalline silicon in the trench has been removed, a uniform homogeneous oxide film can be formed and therefore, the dielectric strength can be improved.

In the method for forming an insulation film on silicon buried in a trench according to the present invention, the procedures may be the same as in the conventional method for forming an insulation film on silicon buried in a trench except that at the time when an oxide film is formed on the surface of polycrystalline silicon in the trench, the surface of the polycrystalline silicon is oxidized after the $Si_3N_4$ film other than the $Si_3N_4$ as the mask for forming the field oxide film or other than the $Si_3N_4$ on the surface of the silicon for formation of an active element has been removed.

DETAILED DESCRIPTION OF THE PREFERRED EMBODIMENTS

Example 1

The present embodiment will now be described with reference to FIGS. 1a through 1d.

Figure 1A:
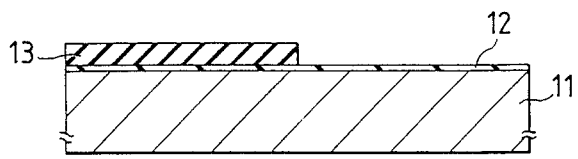
FIGS. 1a through 1e are sectional views illustrating the steps in one embodiment of the present invention.
Figure 1B:
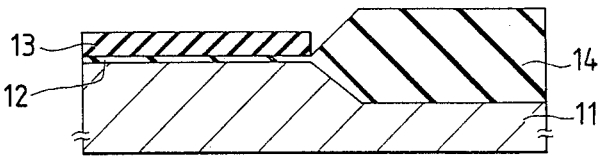
Figure 1C:
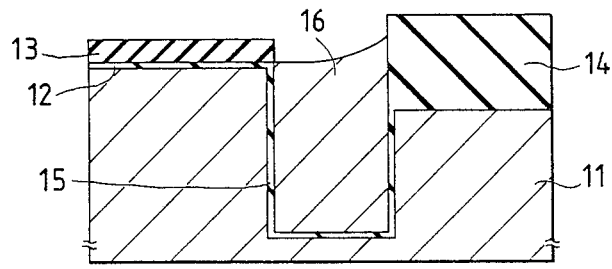
Figure 1D:
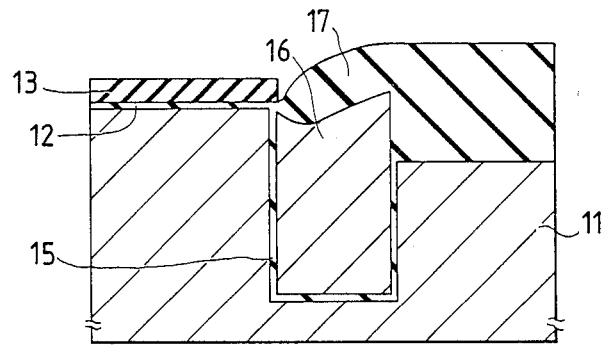

At first, $Si_3N_4$ 13 having a thickness of 120 nm was deposited on the surface of a silicon substrate 11 having an $SiO_2$ film 12 on the surface thereof employing the CVD method (chemical vapor deposition method), and the $Si_3N_4$ was patterned in a shape of a mask for formation of a field oxide film as shown in FIG. 1a. Then, a field oxide film 14 was formed by the above-mentioned selective oxidation method as shown in FIG. 1b, and a trench was formed on the Si substrate by using a photoresist as the mask according to the dry etching method using a plasma of $C_2Br_2F_4$ gas. The width of the Si trench was about 1.6 μm and the depth was 3 μm. An $SiO_2$ film 15 was formed on the side faces and bottom face of this Si trench, and then, polycrystalline silicon 16 was buried in the trench by the CVD method to obtain a structure as shown in FIG. 1c. Then, the surface of the polycrystalline silicon 16 buried in the trench was heated and oxidized in the above-mentioned manner to form an insulation film 17 of $SiO_2$ having a thickness of about 300 nm on silicon buried in the trench, as shown in FIG. 1d.

In the so-formed insulation film 17 on silicon buried in the trench, the thickness was not reduced on the side adjacent to the field oxide film but the thickness on this side was equal to the thickness in the central portion of the trench. Accordingly, even when a gate electrode 23 composed of polycrystalline silicon is formed on the insulation film 17 on the trench type capacitor as shown in FIG. 1e, a sufficient dielectric strength is attained between the gate electrode 23 and the polycrystalline silicon 16.

Figure 1E:
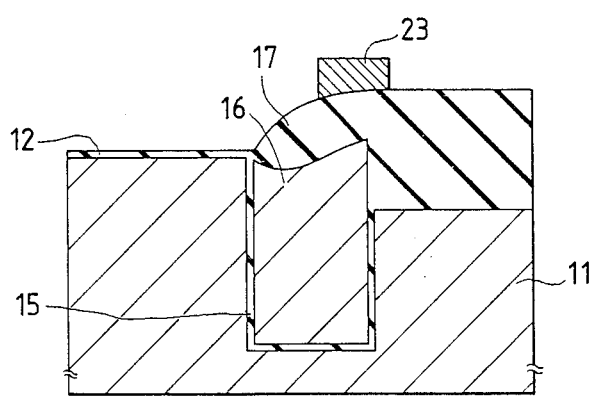
Figure 2A:
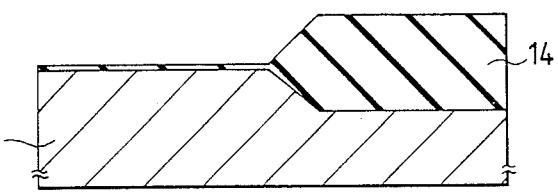
FIGS. 2a through 2e are sectional views illustrating the steps in the conventional technique.
Figure 2B:
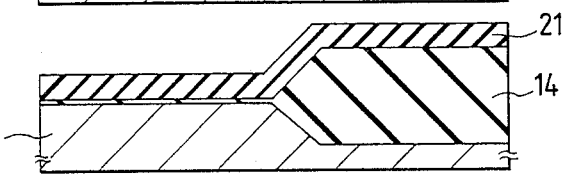
Figure 2C:
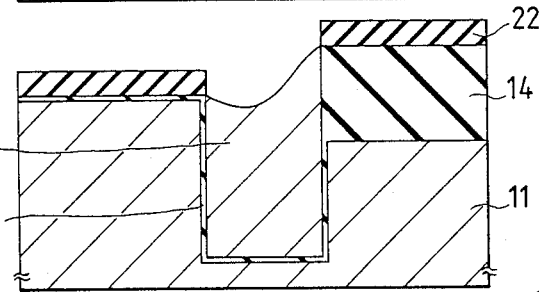
Figure 2D:
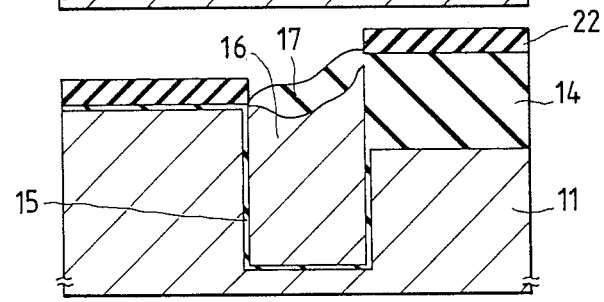
Figure 2E:
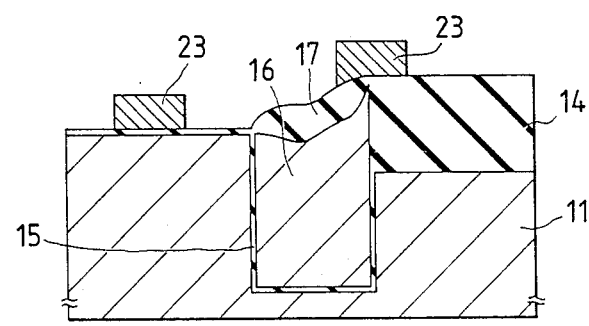
Figure 6:
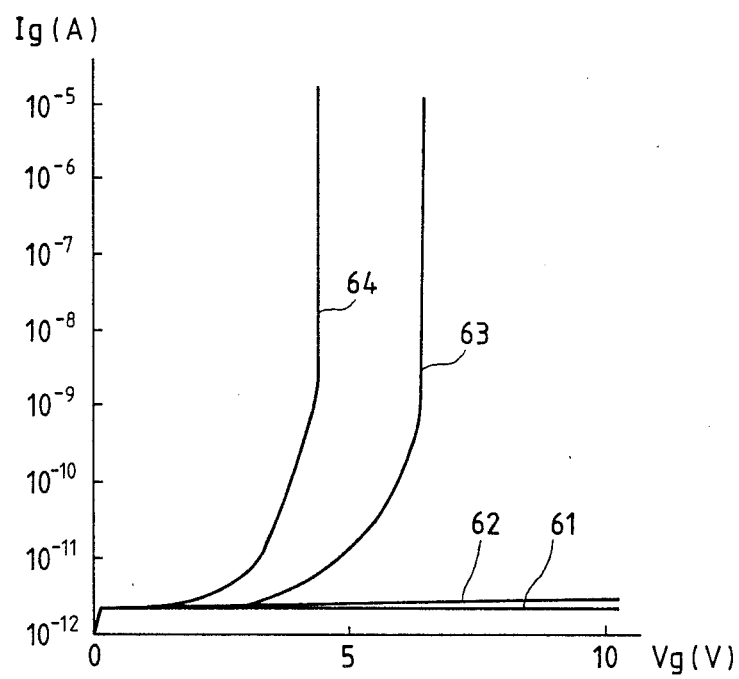
FIG. 6 is a graph illustrating the current-voltage characteristics between the electrode on the insulation film on silicon buried in the trench and the polycrystalline silicon buried in the trench, observed in one embodiment of the present invention and the conventional technique.

When various voltages were applied between the gate electrode 23 and polycrystalline silicon 16 shown in FIG. 1e and a current flowing between them was measured, the results indicated by curves 61 and 62 in FIG. 6 were obtained. In FIG. 6, the current value Ig (A) is plotted on the ordinate and the voltage value Vg (V) is plotted on the abscissa. In this case, the polycrystalline silicon 16 was adjusted to have an n+ type conductivity. Incidentally, the current/voltage relation between the gate electrode 23 formed on the insulation film 17 on silicon buried in the trench and the polycrystalline silicon 16 in the conventional technique, shown in FIG. 2e, is indicated by curves 63 and 64 in FIG. 6. From FIG. 6, it is quite obvious that the insulation film on silicon buried in a trench, prepared according to the method of the present invention, has a high dielectric strength. Incidentally, in a good insulation film, when the Vg value is adjusted to 5 V, no substantial current ordinarily flows.

EXAMPLE 2

In Example 1, a photoresist was used as the mask for forming a trench in the Si substrate. In the case where this mask is formed of an $SiO_2$ system material, in order to prevent etching of a field oxide film below this $SiO_2$ system material at the step of removing the $SiO_2$ material, it is necessary to deposit a film of a material different from $SiO_2$, for example, $Si_3N_4$, between the mask and the field oxide film. This example illustrates an embodiment in which high-quality $SiO_2$ is formed on the surface of polycrystalline silicon buried in the trench in such case. The embodiment will now be described with reference to FIGS. 3a through 3j.

Figure 3A:
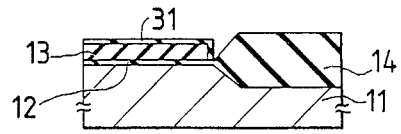
FIGS. 3a through 3j are sectional views illustrating the steps in another embodiment of the present invention.
Figure 3B:
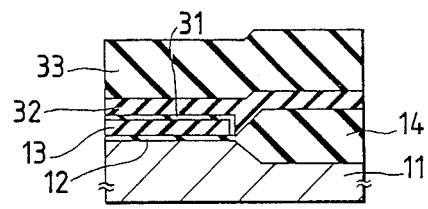
Figure 3C:
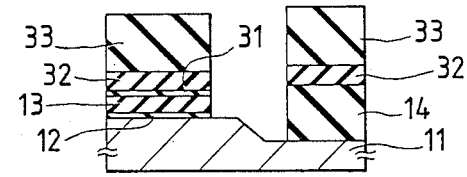
Figure 3D:
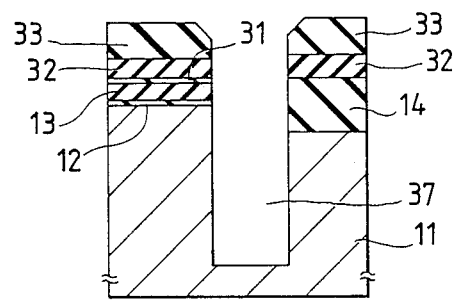

In the same manner as described in Example 1, a field oxide film 14 having a thickness of about 500 nm was prepared under the same conditions as in Example 1 by the selective oxidation method using an $Si_3N_4$ mask 13 for formation of a field oxide film, as shown in FIG. 3a, and while leaving this $Si_3N_4$ mask 13 and a thin oxide film formed thereon, that is, an $SiO_2$ film 31 having a thickness of about 100Å, $Si_3N_4$ 32 having a thickness of about 200 nm and an $SiO_2$ film 33 having a thickness of about 1000 nm were deposited according to the CVD method. This state is shown in FIG. 3b. The field oxide film 14 and each of the insulation films on the silicon substrate 11 were processed to form a hole corresponding to the shape of a trench to be formed in the Si substrate 11, as shown in FIG. 3c. Then, a trench having a width of about 1.6 μm and a depth of 3 μm was formed on the Si substrate 11 by etching using the $SiO_2$ film 33 as the mask. This state is shown in FIG. 3d.

Figure 3E:
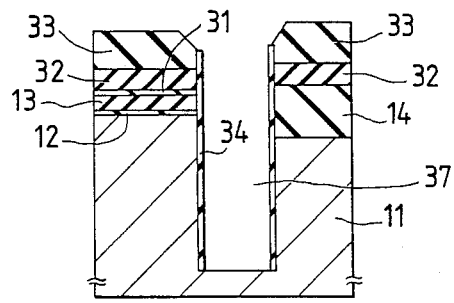
Figure 3F:
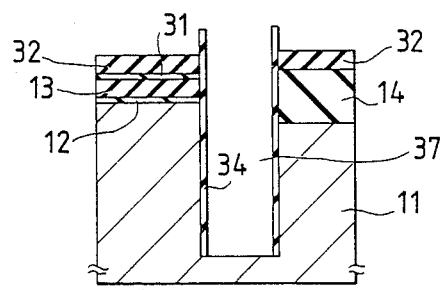
Figure 3G:
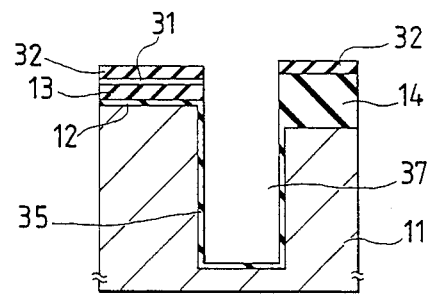

Then, in order to remove the $SiO_2$ film 33 while protecting the field oxide film 14, an $Si_3N_4$ film having a thickness of about 300Å was first deposited on the entire surface including the trench 37 according to the CVD method and then, the $Si_3N_4$ film on the surface of the substrate, that is, the $Si_3N_4$ film on the $SiO_2$ film 33, was removed by the anisotropic dry etching method using a plasma of a fluorine-containing gas such as $CH_2F_2$, while the $Si_3N_4$ 34 on the side wall of the trench was not etched but left. This state is shown in FIG. 3e. Then, the $SiO_2$ 33 was removed by etching with a 10% aqueous solution of HF or a mixture of HF and $NH_4F$ at an $HF/NH_4F$ ratio of 1/20 by using this $Si_3N_4$ 34 as the mask, as shown in FIG. 3f. The etching selectivity ratio of $SiO_2$ to $Si_3N_4$ is 20 in case of the 10% aqueous solution of HF and 100 in case of the 10% aqueous solution of the mixture of HF and $NH_4F$ ($HF/NH_4F=1/20$), and use of the latter solution is preferred. The $Si_3N_4$ 34 protecting the side wall of the trench 37 was removed by immersion in hot phosphoric acid at 160° C. for about 5 minutes, and a capacitor insulation film 35 was formed in the trench 37, as shown in FIG. 3g.

As the capacitor insulation film, there can be recited, for example, i) $SiO_2$ according to the thermal oxidation method or the CVD method, (ii) $Si_3N_4$ according to the thermal nitriding method using $NH_3$ gas or the CVD method, (iii) $Ta_2O_5$ according to the CVD method or the sputtering method, (iv) $KNO_3$ or a ferroelectric substance such as $Pb(Zr_{1-x}Ti_x)O_3$ by the sputtering method, (v) a composite film of (i), (ii) and (iii), and (vi) a composite film of (i), (i), (iii) and (v). In case of the films (i), (ii) and (iii), the thickness is 50 to 200Å and in case of the film (iv), the thickness is 200 to 1000Å. In case of the composite film (v), the total thickness is 50 to 200Å and in case of the composite film vi), the total thickness is 200 to 1000Å, desirably. In the present example, $SiO_2$ according to the thermal oxidation method was used as the capacitor insulation film.

Figure 3H:
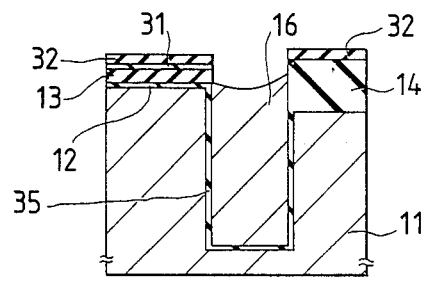
Figure 3I:
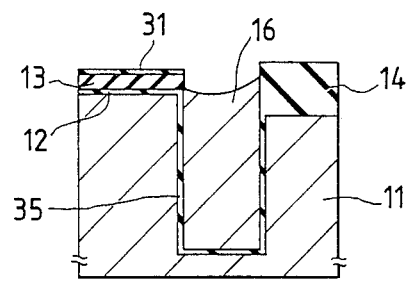

Then, in the same manner as described in Example 1, polycrystalline silicon 16 was buried in the trench 37 as shown in FIG. 3h, and only $Si_3N_4$ 32 was removed, for example, by hot phosphoric acid. In this case, since the $Si_3N_4$ mask 13 used for formation of the field oxide film was protected by the thin $SiO_2$ film 31 formed thereon, the $Si_3N_4$ mask 13 was not etched. This state is shown in FIG. 3i.

Figure 3J:
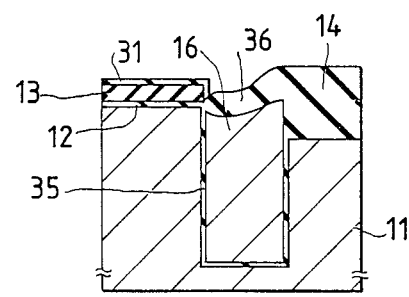

Finally, the polycrystalline silicon 16 buried in the trench was thermally oxidized in the same manner as described in Example 1, whereby an insulation film 36 on silicon buried in the trench, which was composed of high-quality $SiO_2$ and had a thickness of about 300 nm, was formed as shown in FIG. 3j. In this case, since $Si_3N_4$ was not present on the side of the field oxide film 14, local reduction of the thickness of the $SiO_2$ film was not caused, and as in Example 1, an insulation film on silicon buried in a trench, which had a high dielectric strength, could be formed.

Incidentally, in the present example, the $SiO_2$ film 33 was used as the mask for formation of the trench 37, but the material of the mask was not limited to $SiO_2$.

Example 3

In the present example, there are illustrated various trench type capacitor cells prepared by the method for forming an insulation film on silicon buried in a trench according to the present invention.

Figure 4A:
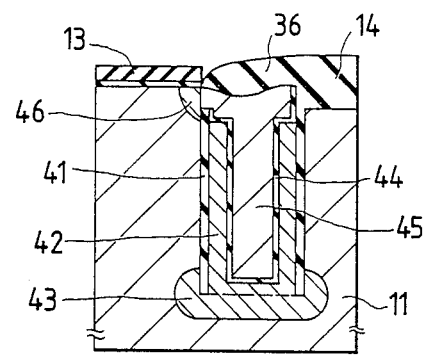
FIGS. 4a through 4f are sectional views illustrating various trench type capacitor cells prepared by utilizing the method of the present invention.
Figure 4B:
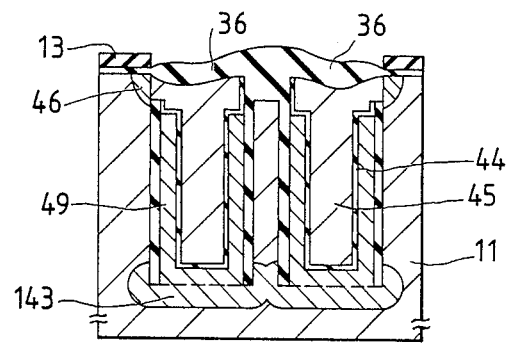
Figure 4C:
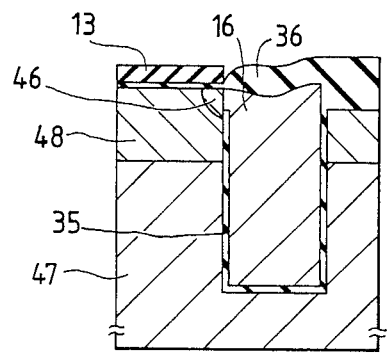
Figure 4D:
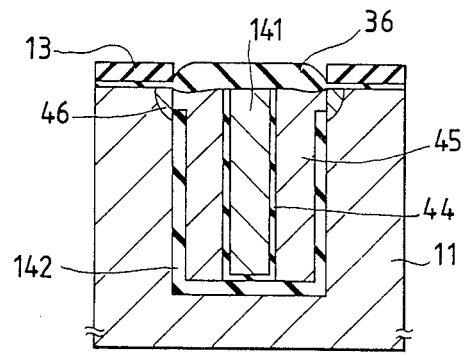
Figure 4E:
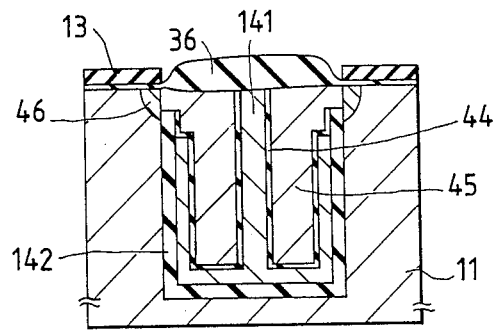
Figure 4F:
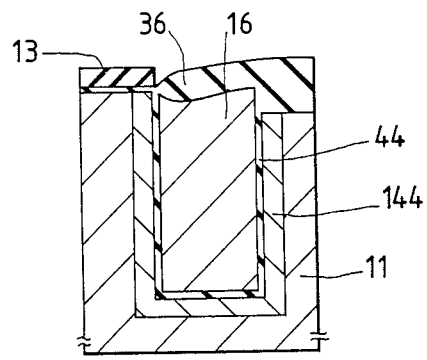

FIG. 4a illustrates an embodiment where the present invention is applied to a trench type capacitor cell having a plate electrode 42 (composed of polycrystalline silicon) of the sheath type having the same potential as that of the the substrate, and FIG. 4b illustrates an embodiment in which the present invention is applied to a capacitor cell having an $n^+$ plate wiring composed of an $n^+$ diffusion layer 143 in the substrate and a sheath type plate composed of $n^+$ polycrystalline silicon 49. FIG. 4c illustrates an embodiment in which the present invention is applied to a capacitor cell comprising a $p^+$ substrate 47 as the substrate plate and FIGS. 4d and 4e illustrate an embodiment in which the present invention is applied to a capacitor cell comprising a plate electrode composed of polycrystalline silicon 141 buried in a trench. Furthermore, FIG. 4f illustrates an embodiment in which the present invention is applied to a capacitor cell having an $n^+$ diffusion layer 144 around a trench.

In each embodiment, $SiO_2$ having a uniform thickness was formed on silicon buried in the trench, and the region where an MOS transistor will be formed in the future was not oxidized.

In FIGS. 4a through 4f, reference numeral 41 represents $SiO_2$, reference numeral 42 represents sheath type $p^+$ polycrystalline silicon, reference numeral 43 represents a $p^+$ diffusion layer, reference numeral 44 represents a capacitor insulation film, reference numeral 45 represents polycrystalline silicon, reference numeral 46 represents an $n^+$ diffusion layer, reference numeral 47 represents a $p^+$ substrate, reference numeral 48 represents a p type epitaxial layer, reference numeral 49 represents a sheath type $n^+$ polycrystalline silicon layer, reference numeral 141 represents polycrystalline silicon, reference numeral 142 represents $SiO_2$, reference numeral 143 represents an $n^+$ diffusion layer, and reference numeral 144 represents an $n^+$ diffusion layer.

EXAMPLE 4

In each of the foregoing examples, $SiO_2$ having a uniform thickness can be formed. However, in the case where thicker $SiO_2$ is formed on silicon buried in a trench by the oxidation method, a problem of unnecessary increase of the thickness of the field oxide film arises.

An embodiment for solving this problem is illustrated in FIGS. 5a through 5k.

Figure 5A:
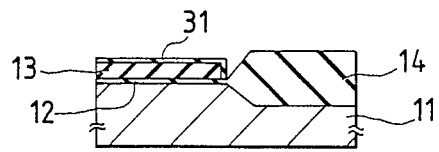
FIGS. 5a through 5k are sectional views illustrating the steps in still another embodiment of the present invention.
Figure 5B:
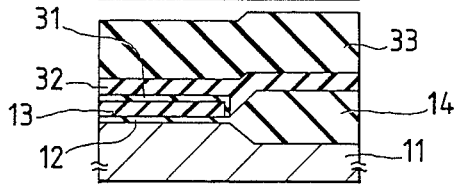
Figure 5C:
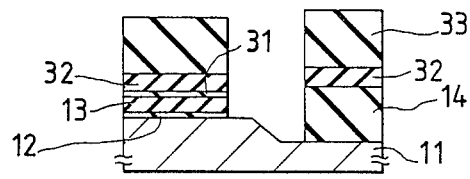
Figure 5D:
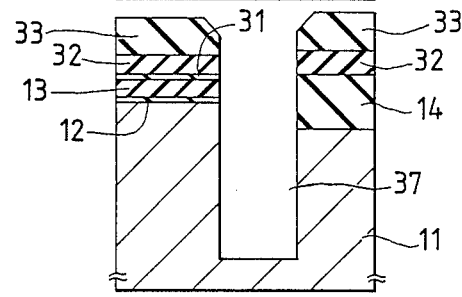
Figure 5E:
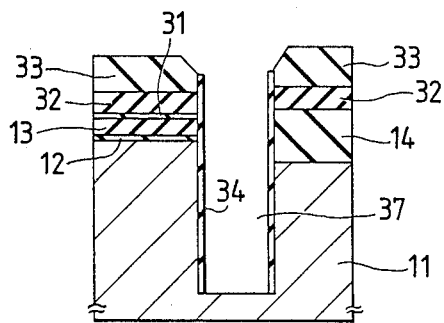
Figure 5F:
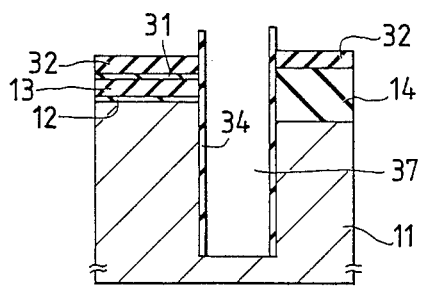
Figure 5G:
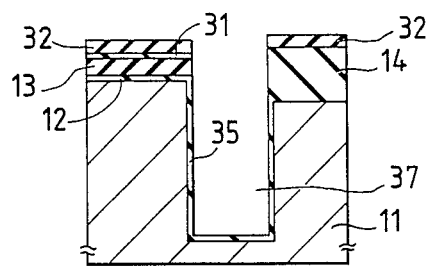
Figure 5H:
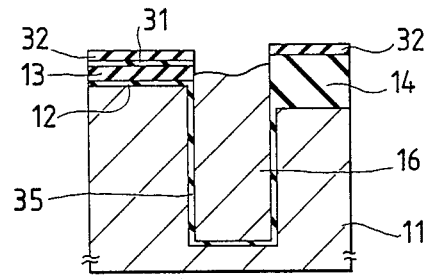
Figure 5I:
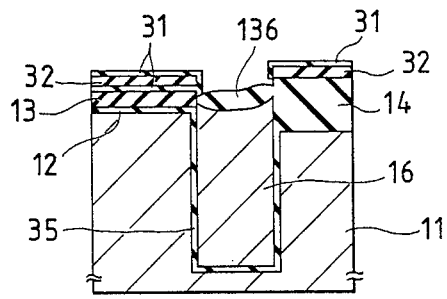
Figure 5J:
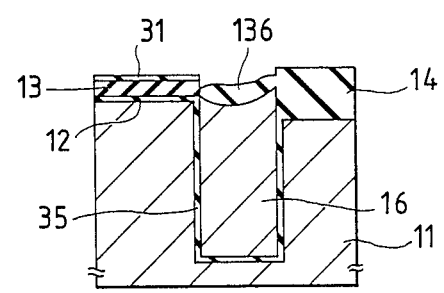
Figure 5K:
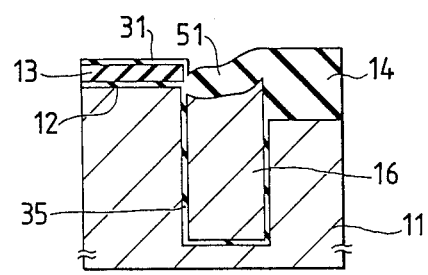

As shown in FIGS. 5a through 5g, in the same manner as described in Example 2, a trench 37 of a substrate 11 and a capacitor insulation film 35 were formed, and then, as shown in FIG. 5h, polycrystalline silicon 16 was buried in the trench 37. Then, a first oxidation treatment was carried out while leaving $Si_3N_4$ 32, and $SiO_2$ 136 was formed, as shown in FIG. 5i. Then, in the same manner as described in Example 2, as shown in FIG. 5j, $Si_3N_4$ 32 was removed, and a second oxidation treatment was carried out so that $SiO_2$ 51 was formed, as shown in FIG. 5k. In this case, the thickness uniformity of $SiO_2$ on polycrystalline silicon buried in the trench was slightly reduced, but $SiO_2$ having a sufficient dielectric strength could be obtained. Moreover, thick $SiO2$ on polycrystalline silicon buried in the trench could be formed without unnecessary increase of the thickness of the field oxide film.

Other procedures and conditions not explained may be the same as those described in Example 2.

As is apparent from the foregoing description, according to the present invention, $SiO_2$ having a uniform thickness can be formed on polycrystalline silicon buried in an Si trench, and therefore, there can be attained an effect of realizing a high dielectric strength.

Incidentally, in the drawings, the same referential numerals represent substantially the same parts and elements.

What is claimed is:

1. A method for forming an insulation film on silicon buried in a trench, which comprises the steps of (i) forming a first mask composed of a first $Si_3N_4$ layer on a silicon substrate, (ii) forming a field oxide film by using the first mask composed of the first $Si_3N_4$ layer, (iii) forming a trench in the silicon substrate, (iv) burying polycrystalline silicon in the trench, and (v) oxidizing the surface of the polycrystalline silicon in the state where no $Si_3N_4$, other than the first $Si_3N_4$ layer of the first mask, is present on the silicon substrate adjacent the trench.

2. A method for forming an insulation film on silicon buried in a trench according to claim 1, wherein the trench is formed using a second mask, the second mask being removed prior to said oxidizing the surface of the polycrystalline silicon.

3. A method for forming an insulation film on silicon buried in a trench according to claim 2, wherein said second mask is composed of photoresist material.

4. A method for forming an insulation film on silicon buried in a trench according to claim 2, wherein, said second mask is composed of a second $Si_3N_4$ layer, the second $Si_3N_4$ layer being removed, adjacent the trench, prior to said oxidizing the surface of the polycrystalline silicon.

5. A method for forming an insulation film on silicon buried in a trench according to claim 4, wherein the first $Si_3N_4$ layer has a silicon oxide film formed thereon, prior to forming the second mask.

6. A method for forming an insulation film on silicon buried in a trench according to claim 1, wherein, after forming the trench and prior to burying polycrystalline silicon in the trench, an insulating film is provided on the surfaces in the trench.

7. A method for forming an insulation film on silicon buried in a trench according to claim 1, wherein the surface of the polycrystalline silicon is oxidized in the state where only regions for formation of active semiconductor elements are covered with $Si_3N_4$.

8. A method for forming an insulation film on silicon buried in a trench according to claim 1, wherein the first $Si_3N_4$ layer has an $SiO_2$ film formed thereon.

9. A method for forming an insulation film on silicon buried in a trench according to claim 1, further comprising the step of forming a gate electrode on the oxide layer formed by said oxidizing the surface of the polycrystalline silicon.

10. A method for forming an insulation film on silicon buried in a trench, which comprises the steps of (i) forming a first mask composed of a first $Si_3N_4$ layer on a silicon substrate; (ii) forming a field oxide film by using the first mask composed of the first $Si_3N_4$ layer; (iii,) forming a second mask composed of at least a second $Si_3N_4$ layer on the silicon substrate , after step (ii); (iii) forming a trench in the silicon substrate by using the second mask; (iv) burying polycrystalline silicon in the trench; (iv′) removing the second $Si_3N_4$ layer on the silicon substrate, adjacent to the trench on the silicon substrate; and (v) after step (iv′), oxidizing the surface of the polycrystalline silicon.

11. A method for forming an insulation film on silicon buried in a trench according to claim 10, wherein, prior to forming the second mask, a silicon oxide film is formed on the first $Si_3N_4$ layer.

12. A method for forming an insulation film on silicon buried in a trench according to claim 10, wherein the steps (ii′), (iii), (iv), (iv′) and (v) are performed without removal of the first mask.

13. A method for forming an insulation film on silicon buried in a trench according to claim 10, wherein the first $Si_3N_4$ layer composing the first mask has a thickness of 50 to 300 nm.

14. A method for forming an insulation film on silicon buried in a trench according to claim 13, wherein the second $Si_3N_4$ layer composing the second mask has a thickness of at least 50 nm.

15. A method for forming an insulation film on silicon buried in a trench, which comprises the steps of (I) forming a first mask composed of a first $Si_3N_4$ layer on a silicon substrate, (II)forming a field oxide film by using the first mask composed of the first $Si_3N_4$ layer, (III) forming a second mask, composed of at least a second $Si_3N_4$ layer, on the silicon substrate, after step (II), (IV) forming a trench in the silicon substrate by using the second mask, (V) burying polycrystalline silicon in the trench, (VI) subjecting the surface of the polycrystalline silicon to a a first oxidation, (VII) removing the second $Si_3N_4$ layer on the silicon substrate, adjacent to the trench on the silicon substrate, and (VIII) after step (VII), subjecting the surface of the polycrystalline silicon to a second oxidation.

16. A method for forming an insulation film on silicon buried in a trench, which comprises the steps of (i) forming a first mask composed of a first $Si_3N_4$ layer on a silicon substrate; (ii) forming a field oxide film by using the first mask composed of the first $Si_3N_4$ layer; (ii′) forming a third mask composed of at least a double layer of a third $Si_3N_4$ layer and an $SiO_2$ layer thereon, on the silicon substrate after the completion of the step (ii); (iii) forming a trench in the silicon substrate by using said third mask; (iv) burying polycrystalline silicon in the trench; (iv′) removing said third $Si_3N_4$ layer on the silicon substrate, adjacent to the trench on the silicon substrate; and (v) after step (iv′), oxidizing the surface of the polycrystalline silicon.

17. A method for forming an insulation film on silicon buried in a trench according to claim 16, wherein, prior to burying polycrystalline silicon in the trench, the $SiO_2$ layer of the third mask is removed.

18. A method for forming an insulation film on silicon buried in a trench according to claim 17, wherein removal of the $SiO_2$ layer of the third mask includes a step of depositing a fourth $Si_3N_4$ layer on surfaces of the trench and then etching the $SiO_2$ layer of the third mask.

19. A method for forming an insulation film on silicon buried in a trench according to claim 18, wherein, after the $SiO_2$ layer of the third mask is removed, the fourth $Si_3N_4$ layer is removed.

20. A method for forming an insulation film on silicon buried in a trench, which comprises the sites of (I) forming a first mask composed of a first $Si_3N_4$ layer on a silicon substrate; (II) forming a field oxide film by using the first mask composed of the first $Si_3N_4$ layer; (III′) forming a third mask composed of at least a double layer of a third $Si_3N_4$ layer and an $SiO_2$ layer thereon, on the silicon substrate after the completion of the step (II); (IV) forming a trench in the silicon substrate by using the third mask; (IV′) removing the $SiO_2$ layer on the third $Si_3N_4$ layer; (V) burying polycrystalline silicon in the trench; (IV) subjecting the surface of the polycrystalline silicon to a first oxidation; (VII) removing the third $Si_3N_4$ layer on the silicon substrate, adjacent to the trench on the silicon substrate; and (VIII) after step (VII), subjecting the surface of the polycrystalline silicon to a second oxidation burying.

* * * * *